United States Patent [19]
Hong

[11] Patent Number: 5,665,621
[45] Date of Patent: Sep. 9, 1997

[54] READ-ONLY-MEMORY PROCESS WITH SELF-ALIGNED CODING

[75] Inventor: Gary Hong, Hsinchu, Taiwan

[73] Assignee: United Microelectronics Corporation, Taipei, Taiwan

[21] Appl. No.: 577,031

[22] Filed: Dec. 22, 1995

[51] Int. Cl.$^6$ ................................................ H01L 21/8246
[52] U.S. Cl. ............................................................ 438/278
[58] Field of Search .................... 437/48, 52, 60, 437/45, 43, 235, 238; 438/48

[56] References Cited

U.S. PATENT DOCUMENTS

| | | | |
|---|---|---|---|
| 5,472,898 | 12/1995 | Hong et al. | 437/48 |
| 5,523,251 | 6/1996 | Hong et al. | 437/48 |

*Primary Examiner*—Jey Tsai
*Attorney, Agent, or Firm*—Townsend and Townsend and Crew LLP

[57] ABSTRACT

A process of fabricating a read-only-memory using a self-aligned technique for coding. By forming cap layers on word lines and forming stoppers between the stacked word lines/cap layers, sufficient tolerance for coding mask misalignment can be provided to ensure the alignment of coding even when misalignment happens. Therefore the problem of partially turned-off adjacent memory cells is eliminated.

21 Claims, 5 Drawing Sheets

READ-ONLY-MEMORY PROCESS WITH SELF-ALIGNED CODING

BACKGROUND OF THE INVENTION

The present invention is related to a process of manufacturing a read-only-memory (ROM), and more particularly to a process of manufacturing a read-only-memory with self-aligned ROM coding.

Read-only-memory had been intensively used among digital equipments like mini-computers, and microprocessor systems, for storing invariable programs and/or data for system operation. Since read-only-memory is non-volatile, usually a client first sends his program to a ROM manufacturing factory, then the program is built or coded into ROMs. Thereafter, the ROMs are finished and sent to the client. The manufacturing process of ROM is very complicated, having many steps, each takes time and must be processed and controlled precisely. Because most ROM elements have the same structure but only differ in the data stored therein during the programing stage, processing steps before programming stage can be performed to produce half-finished products. When an order is placed by the client for storing a specified program into ROMs, a mask for the program can be rapidly produced. The half-finished ROMs can then be programmed and sent to the client as soon as possible. Therefore, post-programmed mask ROMs have become widely used in this art.

The most commonly used structure of ROM is so-called flat-cell structure having buried bit lines because it occupies the least amount of space on a chip, therefore it is very suitable for high-capacity memory applications. However, as known in the art, mask misalignment frequently happens in manufacturing process of integrated circuit (IC). In the ROM coding step, the problems of mask misalignment and lateral diffusion of implanted impurities often cause adjacent cells to be partially turned off (if they are supposed to be "ON" cells) or to have lower read current, especially the cells that are far from the voltage source ($V_{cc}$).

More specifically, please refer to FIG. 1 and FIG. 2 which show a conventional ROM structure having buried bit lines. FIG. 2 is a schematic top view of the layout of the ROM. FIG. 1 is a schematic cross-sectional view taken along line I—I in FIG. 2. The conventional ROM includes lateral $N^+$ source/drain regions 10, which are also termed buried bit lines (BN⁺), and longitudinal polysilicon gate regions 12, which are also termed word lines. Channel regions 14 are formed between every two adjacent buried bit lines 10 and underneath stacked gate oxide 16/word lines 12. In the coding step, a photoresist 18 is deposited and then patterned by using a coding mask to expose desired or planned channel regions, like the code areas 20 and 22 as shown in FIGS. 1 and 2. In the drawings, code area 20 shows a misalignment condition. Code area 22 shows the proper alignment condition. After that, ROM code implantation takes place by, for example, implanting $B^+$ ions into channel regions 14, to disable the coded channel regions permanently.

As stated above, if the coding mask is misaligned, the implanted ions may laterally diffuse into adjacent "ON" memory cells. This may partially turn off the memory cells, reduce their read current and even cause wrong output of coded data.

SUMMARY OF THE INVENTION

It is therefore a primary object of the present invention is to provide a process of fabricating a ROM which is capable of implanting ions into planned or desired channels in self-aligned fashion even though the coding mask is misaligned. This effectively prevents partial turned-off of adjacent cells due to lateral diffusion of ions.

According to the fabricating process of the present invention, thick stopper material, like photoresist, is formed between the word lines to stop ions so that ions can only pass through the word lines and thus into the underlying channel regions in self-aligned fashion. Therefore, since misalignment allowance is greatly increased by disposing the stopper material, the deficiencies of the conventional process can be eliminated.

The objects of the present invention are fulfilled by providing a process of fabricating a non-volatile memory with self-aligned coding on a semiconductor substrate. The fabricating process comprises the steps of: (a) forming buried bit lines in the semiconductor substrate and forming word lines on the substrate; (b) forming cap layers coveting the word lines; (c) forming stoppers between the stacked word lines/cap layers, the thickness of the stoppers being larger than the thickness of the word lines; (d) forming a coding mask and defining planned coding windows; (e) removing the cap layers which are exposed through the coding windows; and (f) implanting ions into the substrate through the word lines which are exposed through the coding windows, while the stoppers are used to prevent penetration of the ions.

After coding, the coding mask and stoppers are removed. The cap layers can be removed or remained. The above step (c) may comprise the steps of depositing a photoresist; etching back the photoresist to expose the top surfaces of the cap layers; and baking the photoresist to increase its hardness.

According to another aspect of the present invention, a process of fabricating a non-volatile memory on a semiconductor substrate, comprises the following steps of: (a) forming buried bit lines in the semiconductor substrate and forming word lines on the substrate; (b) forming cap layers covering the word lines; (c) forming stoppers between the stacked word lines/cap layers; (d) removing the cap layers; (e) forming a coding mask and defining planned coding windows; and (f) implanting ions into the substrate through the word lines which are exposed through the coding windows, while the stoppers are used to prevent penetration of the ions.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Figure 1:
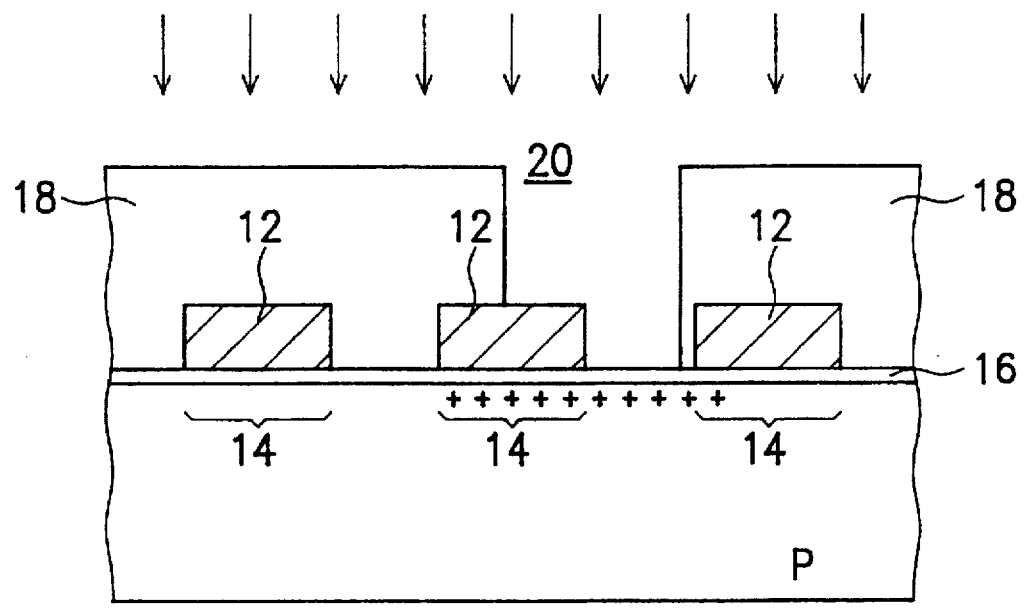
FIG. 1 is a cross-sectional side view of the structure of a conventional ROM taken along line I—I in FIG. 2.
Figure 2:
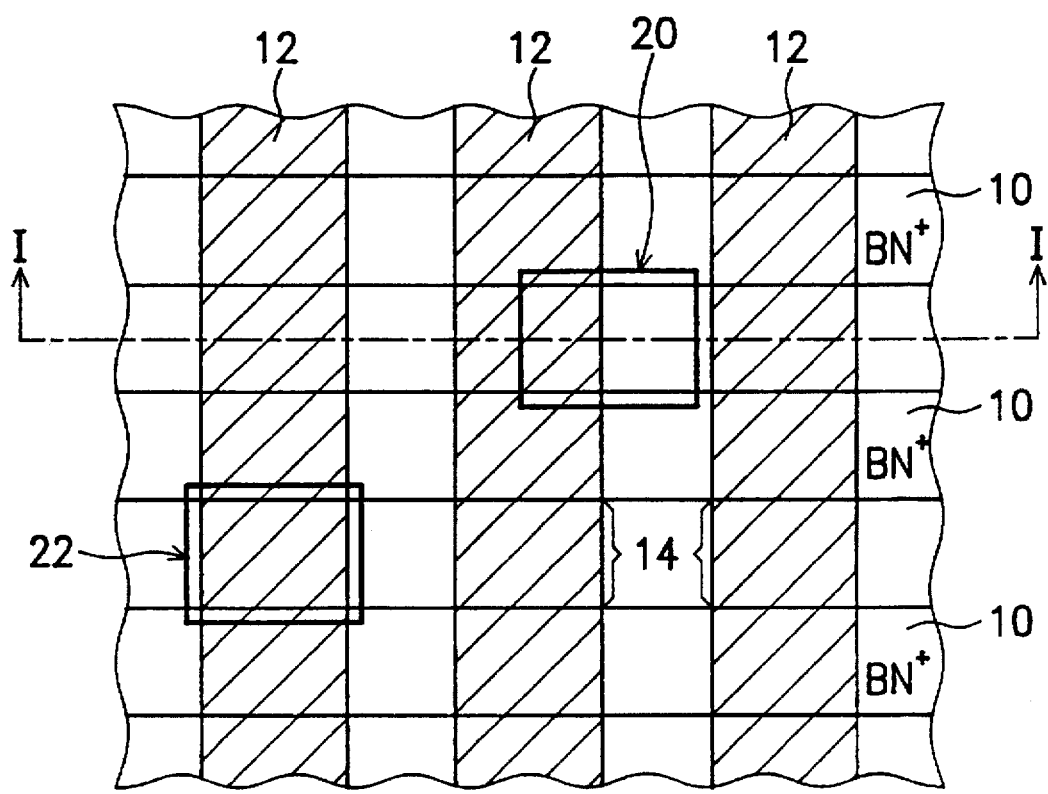
FIG. 2 is a top view of the layout of the conventional ROM.

A first preferred embodiment of the present invention is shown in FIGS. 3a through 3f, which is applied to a P-type silicon substrate 30 having buried bit lines to produce a ROM or non-volatile memory. The buried bit lines are not shown in the FIGS. 3a to 3f because the cross-sectional side views are taken along channel regions, but they are similar to those shown in FIG. 2. The fabricating process can be also applied to an N-type silicon substrate, too. The formation of buried bit lines could be done by conventional photolithography and implantation techniques.

Figure 3A:
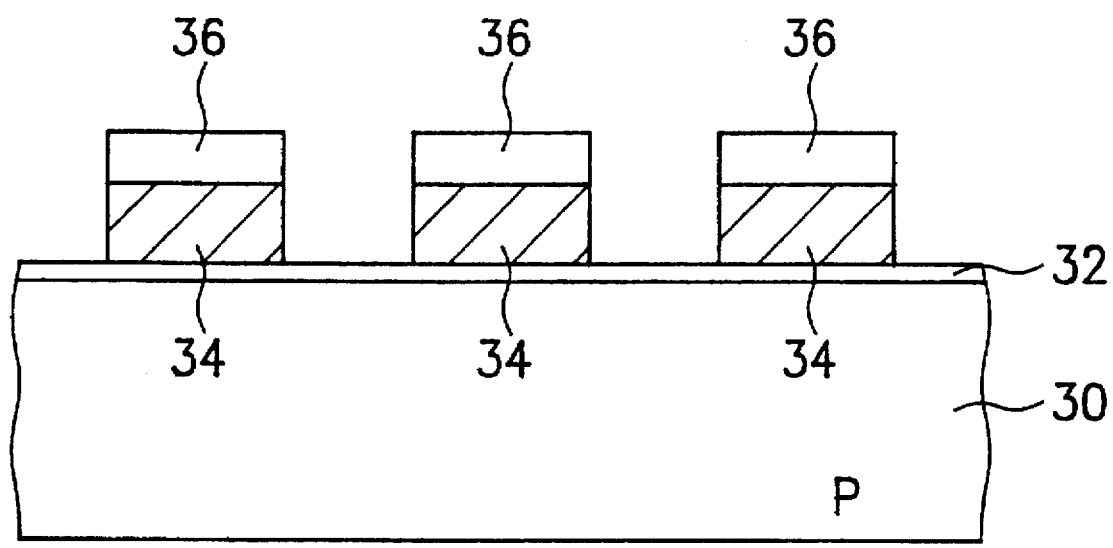
FIGS. 3a through 3f show cross-sectional side views of a preferred embodiment of the present invention throughout various processing steps.

Referring first to FIG. 3a, a gate oxide layer 32 is grown on the substrate 30. In the present embodiment, the thickness of the gate oxide layer 32 is about 60 to 200 angstroms. After that, a gate layer and a cap layer are deposited on the gate oxide layer 32 serially and patterned to form a word line structure. As shown in the figure, the patterned structure includes substantially equally spaced word lines 34 and cap layers 36 overlying the word lines 34. In this embodiment, the word lines 34 may be made from polysilicon or polycide with a thickness of between 1000 and 4000 angstroms. The cap layers 36 may be any suitable material having a sufficient etch selectivity with the word lines 34. For example, the cap layers 36 may be made from silicon oxide or silicon nitride with a thickness of between 1000 and 5000 angstroms.

Figure 3B:
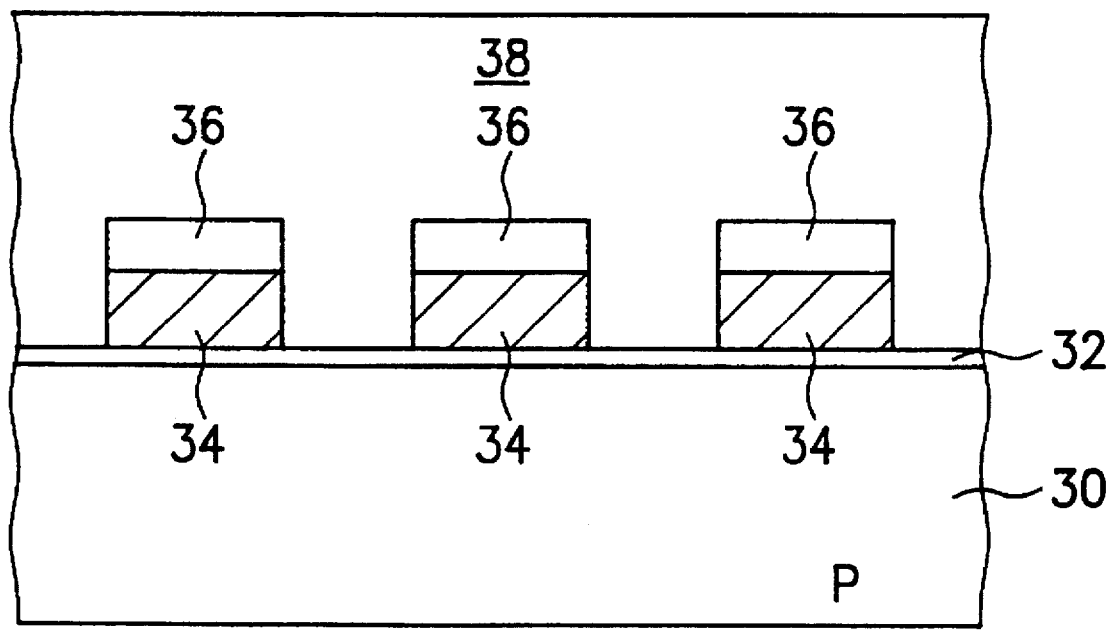
Figure 3C:
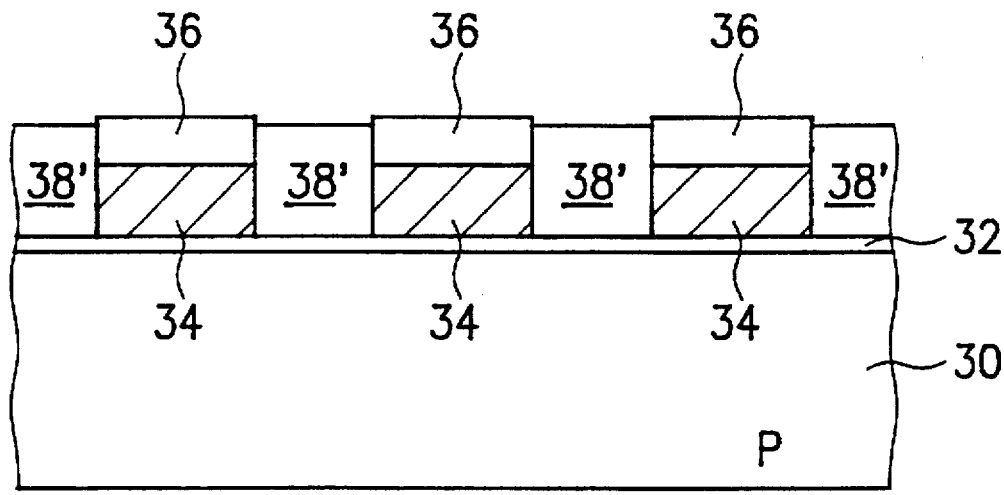

Referring to FIG. 3b, a photoresist 38 is deposited over the entire structure. Then the photoresist 38 is etched back until the top surface of the cap layers 36 is exposed, as shown in FIG. 3c. Therefore, photoresist layers 38' are formed in the gaps between every two adjacent stacked word line 34/cap layer 36 structures, and the thickness of the photoresist layer 38' is controlled to be greater than that of the word lines 34. The photoresist layers 38' are baked by ultraviolet radiation to increase their hardness.

The structure shown in FIG. 3c is the half-finished product of the ROM according to this preferred embodiment of the present invention. When a program order is placed by a customer, a coding mask can be made according to the program immediately for coding procedures stated hereinafter.

Figure 3D:
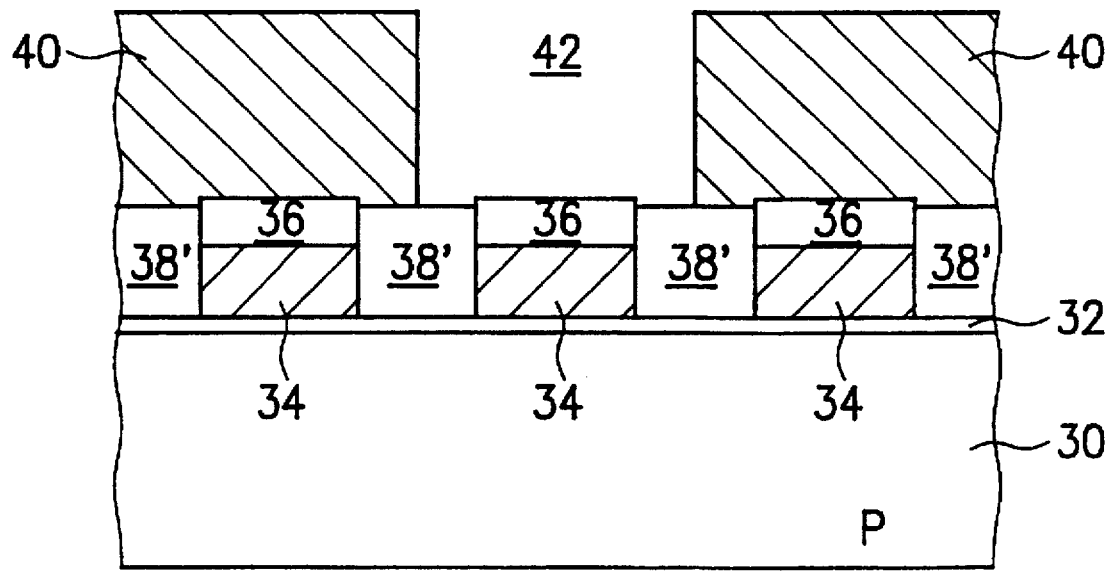

Referring to FIG. 3d, a second photoresist 40 is deposited and developed to define planned code windows 42 by using the coding mask. The photoresist layers 38' will not be removed during the development of the second photoresist 40 because it had been baked by ultraviolet radiation.

Figure 3E:
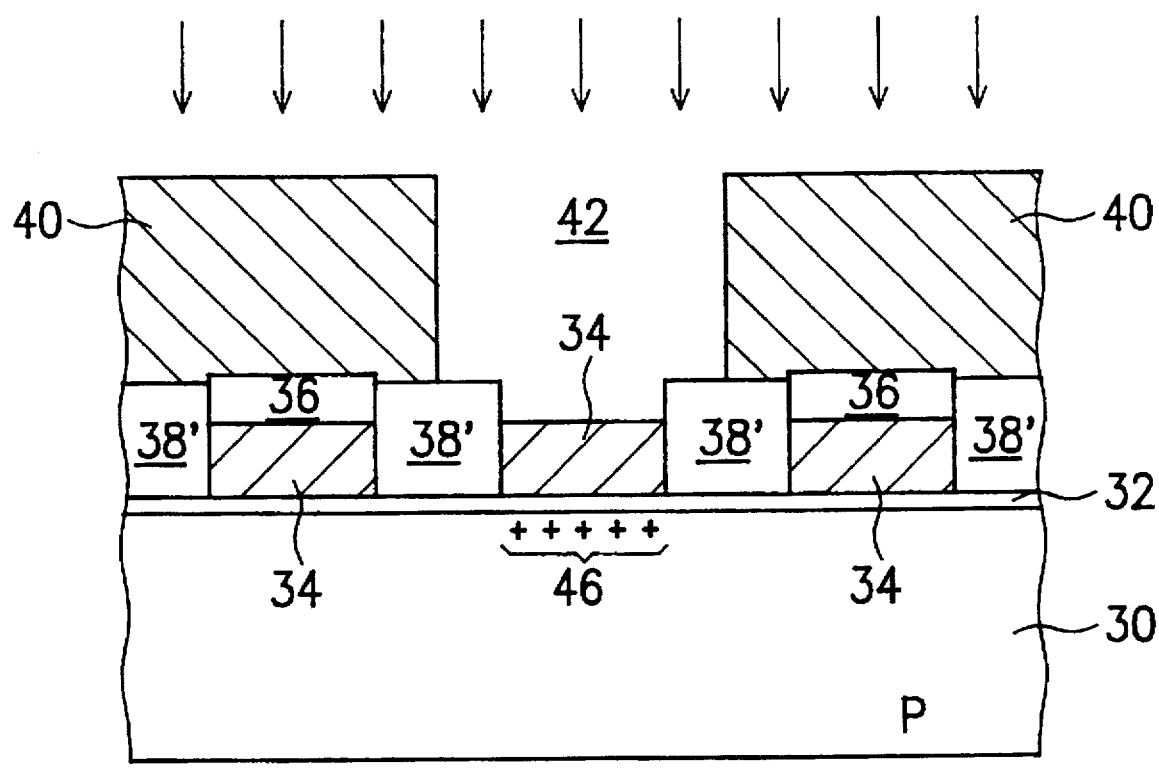

Referring to FIG. 3e, the cap layers 36 exposed through the code windows 42 are removed by etching. Ion implantation coding is then implemented. In this embodiment, the implantation can use boric ions (B$^+$) with a preferable kinetic energy in a range between 100 and 400 KeV and a preferable dosage of about $1 \times 10^{14}$ atoms/cm$^2$. Since the thick photoresist layers 38' can stop ions, boric ions will not penetrate the photoresist layers 38' but will only penetrate the thinner word lines 34 and enter the channel regions 46 right under the word lines 34. Therefore, the coding implantation is self-aligned with desired channel regions and will not affect adjacent memory cells. According to the present invention, the width of the photoresist layers 38' can provide sufficient misalignment tolerance to ensure the alignment of coding even when misalignment happens.

Figure 3F:
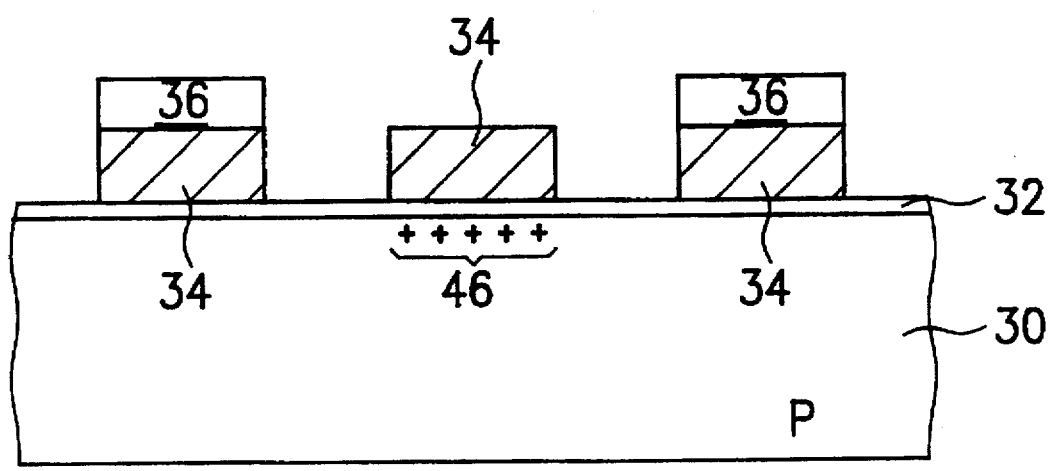

Referring to FIG. 3f, after coding, the photoresist layers 38' and the second photoresist 40 are removed. The ROM structure shown in FIG. 3f is completed. The cap layers 36 can be removed or remained. Other follow-up steps, like BPSG planarization, metal contact, metallization, and passivation, are the same as with conventional processes, and will not be further discussed.

Figure 4A:
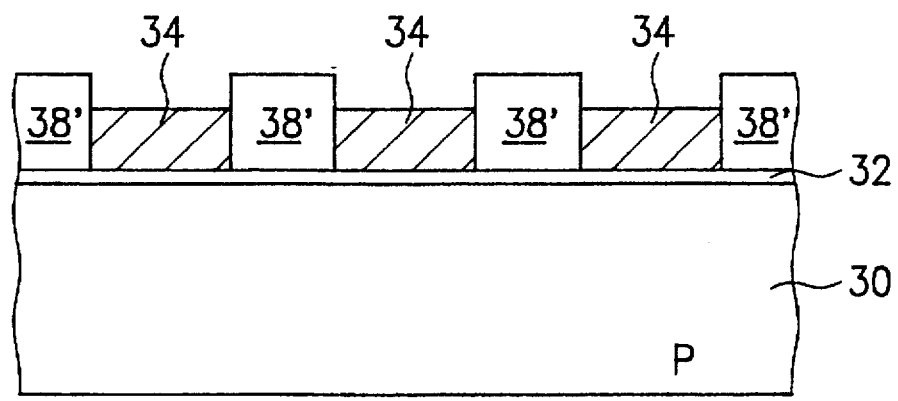
FIGS. 4a through 4c show cross-sectional side views of another preferred embodiment of the present invention throughout various processing steps.
Figure 4B:
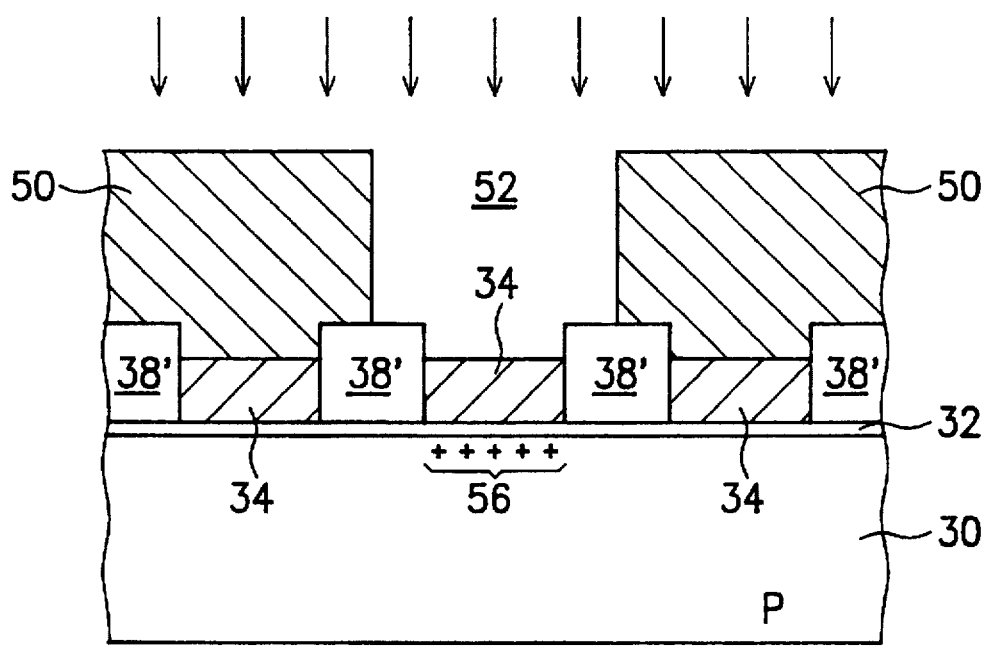
Figure 4C:
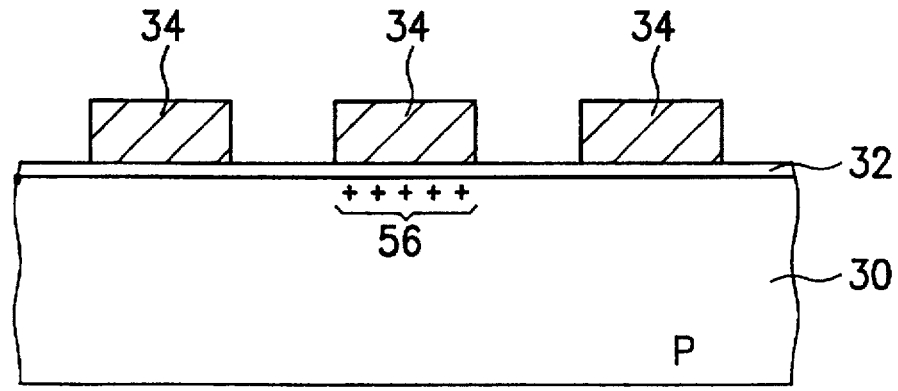

A second preferred embodiment of the present invention is shown in FIGS. 4a to 4c. The second embodiment has the same procedures as the first embodiment from FIG. 3a to FIG. 3c. After the structure shown in FIG. 3c is completed, the cap layers 36 are all removed to form a half-finished product as shown in FIG. 4a.

The coding procedure is shown in FIG. 4b. A second photoresist 50 is coated. A coding mask is used to define desired or planned code windows 52. Ion implantation coding is then implemented. Since the thick photoresist layers 38' can stop ions, ions will not penetrate the photoresist layers 38' but will only penetrate the thinner word lines 34 and enter the channel regions 56 right under the word lines 34. Therefore, the ions are self-aligned with the desired channel regions and will not affect adjacent memory cells. According to the present invention, the width of the photoresist layers 38' can provide sufficient misalignment tolerance to ensure the alignment of coding even when misalignment happens.

Referring to FIG. 4c, after coding, the photoresist layers 38' and the second photoresist 50 are removed. The ROM structure shown in FIG. 4c is completed. Other follow-up steps, like BPSG planarization, metal contact, metallization, and passivation, are the same with conventional processes, and will not be further discussed.

Although not described in detail, it is apparent that the present invention could be either applied to P-type or N-type silicon substrate to fabricate N-channel transistors or P-channel transistors. This is familiar to those skilled in the art. Similarly, the materials, conductivity type, values, conditions described above in the preferred embodiments are just illustrative but not used to limit the scope of the present invention.

As stated above, the implanted ions are self-aligned into planned channels for coding, even if the coding mask is misaligned. Thus, partially turned-off adjacent memory cells due to lateral diffusion of ions are eliminated.

While the invention has been described by way of examples and in terms of preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process of fabricating a non-volatile memory on a semiconductor substrate, comprising the following steps of:
   (a) forming buried bit lines in the semiconductor substrate and forming word lines on the semiconductor substrate;
   (b) forming cap layers over the word lines to form stacked word lines/cap layers;
   (c) forming stoppers between the stacked word lines/cap layers with a resulting thickness of the stoppers from the semiconductor substrate being larger than a thickness of the word lines relative to the semiconductor substrate, (1) depositing a photoresist on the semiconductor substrate between and over the stacked word lines/cap layers,
   (2) etching back the photoresist to form exposed top surfaces of the cap layers with photoresist therebetween, the photoresist having a resulting thickness relative to the semiconductor substrate larger than the thickness of the word lines relative to the semiconductor substrate;

(d) forming a coding mask and defining planned coding windows;

(e) removing the cap layers which are exposed through the coding windows; and, (f) implanting ions into the semiconductor substrate through the word lines which are exposed through the coding windows, the stoppers being used to prevent penetration of the ions.

2. The fabrication process as claimed in claim 1, further comprising the step of removing said coding mask and said stoppers.

3. The fabrication process as claimed in claim 2, further comprising the step of further comprising the step of removing the cap layers.

4. The fabrication process as claimed in claim 2, wherein said step (c) comprises the steps of depositing a photoresist; etching back said photoresist to expose the top surfaces of said cap layers; and baking said photoresist to increase its hardness.

5. The fabrication process as claimed in claim 4, further comprising the step of forming a gate oxide layer between said word lines and the substrate.

6. The fabrication process as claimed in claim 5, wherein said word lines are made from polysilicon with a thickness of between about 1000 and 4000 angstroms.

7. The fabrication process as claimed in claim 5, wherein said word lines are made from polycide with a thickness between of about 1000 and 4000 angstroms.

8. The fabrication process as claimed in claim 5, wherein said cap layers are made from silicon oxide with a thickness of between about 1000 and 5000 angstroms.

9. The fabrication process as claimed in claim 5, wherein said cap layers are made from silicon nitride with a thickness of between about 1000 and 5000 angstroms.

10. The fabrication process as claimed in claim 5, wherein said step (f) comprises the step of implanting boric ions with a kinetic energy between about 100 to 400 KeV and with a dosage of about $1 \times 10^{14}$ atoms/cm$^2$.

11. A process of fabricating a non-volatile memory on a semiconductor substrate, comprising the following steps of:

(a) forming buried bit lines in the semiconductor substrate and forming word lines on the semiconductor substrate;

(b) forming cap layers over the word lines to form stacked word lines/cap layers;

(c) forming stoppers between the stacked word lines/cap layers by, (1) depositing a photoresist on the semiconductor substrate between and over the stacked word lines/cap layers, (2) etching back the photoresist to form exposed top surfaces of the cap layers with photoresist therebetween;

(d) removing the cap layers;

(e) forming a coding mask and defining planned coding windows; and, (f) implanting ions into the semiconductor substrate through the word lines which are exposed through the coding windows, wherein the stoppers are used to prevent penetration of the ions.

12. The fabrication process as claimed in claim 11, further comprising the step of removing said coding mask and said stoppers.

13. The fabrication process as claimed in claim 12, wherein said step (c) comprises the steps of depositing a photoresist; etching back said photoresist to expose the top surfaces of said cap layers; and baking said photoresist to increase its hardness.

14. The fabrication process as claimed in claim 13, further comprising the step of forming a gate oxide layer between said word lines and the substrate.

15. The fabrication process as claimed in claim 14, wherein said word lines are made from polysilicon with a thickness of between about 1000 and 4000 angstroms.

16. The fabrication process as claimed in claim 14, wherein said word lines are made from polycide with a thickness of between about 1000 and 4000 angstroms.

17. The fabrication process as claimed in claim 14, wherein said cap layers are made from silicon oxide with a thickness of between about 1000 and 5000 angstroms.

18. The fabrication process as claimed in claim 14, wherein said cap layers are made from silicon nitride with a thickness of between about 1000 and 5000 angstroms.

19. The fabrication process as claimed in claim 14, wherein said step (f) comprises the step of implanting boric ions with a kinetic energy between about 100 to 400 KeV and with a dosage of about $1 \times 10^{14}$ atoms/cm$^2$.

20. The fabrication process as claimed in claim 1 and wherein the forming of the stoppers includes:

(3) baking the etched back photoresist to increase its hardness.

21. The fabrication process as claimed in claim 11 and wherein the forming of the stoppers includes:

(3) baking the etched back photoresist to increase its hardness.

* * * * *